United States Patent [19]

Terao et al.

[11] 4,238,803
[45] Dec. 9, 1980

[54] INFORMATION RECORDING METHODS USING LASERS

[75] Inventors: Motoyasu Terao, Tokyo; Seiji Yonezawa, Hachioji, both of Japan

[73] Assignee: Hitachi, Ltd., Japan

[21] Appl. No.: 829,892

[22] Filed: Sep. 1, 1977

[30] Foreign Application Priority Data

Sep. 3, 1976 [JP] Japan .................. 51-104853

[51] Int. Cl.² .................. G01D 15/34; G01D 15/10
[52] U.S. Cl. .................. 346/1.1; 250/316.1; 346/76 L; 346/135; 346/151; 274/46 A; 427/53; 430/320; 430/396; 430/DIG. 945; 358/128; 350/274; 350/320
[58] Field of Search .................. 427/53; 106/37; 204/5; 264/106, 107; 346/1, 76 L, 135; 96/36, 88, 35, 85, 67

[56] References Cited

U.S. PATENT DOCUMENTS

| 2,938,816 | 5/1960 | Günther | 427/250 X |
|---|---|---|---|
| 3,636,526 | 1/1972 | Feinleib | 346/135 X |
| 3,641,510 | 2/1972 | Chen | 346/135 X |
| 3,655,256 | 4/1972 | Claytor et al. | 346/135X |
| 3,707,372 | 12/1972 | Hallman et al. | 96/35 |
| 3,959,799 | 5/1976 | Gambino et al. | 346/135 |
| 3,990,084 | 11/1976 | Hamisch et al. | 346/135 |
| 4,032,691 | 6/1977 | Kido et al. | 346/76 L X |
| 4,127,414 | 11/1978 | Yoshikawa et al. | 96/67 |

*Primary Examiner*—Michael F. Esposito
*Assistant Examiner*—Thurman K. Page
*Attorney, Agent, or Firm*—Craig & Antonelli

[57] ABSTRACT

A thin film is formed on a substrate, which film is made of a substantially amorphous chalcogenide having a composition of $As_x \cdot Te_y \cdot Se_z \cdot G_g$, where G represents at least an element selected from a group consisting of S, In, Tl, Sn, Pb and Ge, and where 10 at $\% \leq x \leq 25$ at %, 50 at $\% \leq y \leq 88$ at %, 0 at $\% \leq z \leq 40$ at % and 0 at $\% \leq g \leq 10$ at %, and that $x+y+z+g=100$ and $z+g \neq 0$. A laser beam is projected onto the thin film to form in it recesses representing information carried by the laser beam. The information recorded in the thin film exhibits a high signal-to-noise ratio and a high γ characteristic. Besides, the recorded information is scarcely subjected to deterioration independently from time elapse.

35 Claims, 10 Drawing Figures

INFORMATION RECORDING METHODS USING LASERS

BACKGROUND OF THE INVENTION

1. Field of the Invention

The present invention relates to a method of recording information such as video or audio signals, data of electronic computer or the like in a recording medium formed on a preselected substrate with the aid of laser ray or beam on a real time basis. In particular, the invention is concerned with a recording method of information in which phenomena such as thermal evaporation, melting or displacement of material constituting the recording medium under the action of the laser beam or ray are utilized for the recording.

2. Description of the Prior Art

In recent years, attention has been increasingly paid to the information recording method in which information is written in a thin film of metal or the like formed on a substrate by using a laser ray or beam. According to such a method, the information recording has been accomplished by forming holes or recesses in the metallic thin film under the action of a thermal energy a beam such as laser ray.

There have been already published some reports concerning the fundamental methods of recording and reproducing information in or from a recording disk by using light beams. For example, reference is to be made to a literature entitled "A Review of the MCA Disco-Vision System" submitted by Kent Broadbent in "the 115-th SMPTE Technical Conference & Equipment Exhibit" held on Apr. 26, 1976. In the first place, a brief explanation will be made on the principle of such known method for a better understanding of the invention.

Referring to FIG. 1 which illustrates a principle of the method of recording information on a disk by means of a light beam, the disk denoted by reference numeral 1 comprises a substrate 2 which is usually formed of glass or the like material and a thin film 3 of recording medium deposited on a surface of the substrate, as described in detail hereinafter. The disk 1 is adapted to be rotated at a high speed through a rotatable shaft 4. There is disposed over the disk 1 with a predetermined short distance spaced therefrom a lens 5 through which a laser beam 6 which has undergone a pulse-like modulation depending on the information to be recorded is focussed onto the recording thin film 3 for irradiation thereof. Consequently, the portion of the recording thin film which has been irradiated with the laser beam 6 is heated to be molten and displaced or evaporated. The size, configuration and position of hole or recess thus formed in the recording film and having usually a shorter diameter on the order of 0.5 to 1.2 $\mu$m will correspond to the information carried by the applied laser beam 6. In this manner, information such as video signals, audio signals or the like can be stored in the recording film as the corresponding holes or recesses, which holes or recesses may or may not penetrate the entire thickness of the recording film. When the stored information is to be reproduced, the disk 1 is rotated at the same high speed as in the case of the information recording and at the same time a reading-out light beam such as a laser beam is focussed and projected on to the recording film. Through detection of intensity or the like characteristics of the resulting reflected ray, it is possible to determine the presence or absence of holes and recesses, positions, sizes and shapes thereof, thereby to reproduce the recorded information.

There have been hitherto known various types of recording mediums which can be used for the recording film in the information recording method described above. As typical examples, recording medium of Bi (refer to Japanese Patent Publication No. 40479/1971), recording medium of Bi-Se in Bi/Se ratio of (2.5~3.5)/1 (refer to Japanese Laid-Open Patent Application No. 87304/1975), medium of chalcogen glass (Japanese Laid-Open Patent Application No. 42849/1975), and a medium containing crystalline chalcogen as the main component (Japanese Laid-Open Patent Application No. 51733/1975) may be enumerated.

Hitherto known materials for the recording medium as mentioned above are not yet used at present in practical applications for the reasons that the signal-to-noise ratio of the read-out signal of the information which has been stored with a high density is excessively low, the information as written-in tends to become unstable, and so forth. For example, in the case of the recording medium of Bi or Bi-Se, it is known that the shape of recesses formed through the irradiation of the laser beam will often become irregular. Under such situation, the information as read-out will contain a large proportion of noise components and thus the signal-to-noise ratio higher than 25 dB will hardly be attained. Even when the recording is made on the same recording medium, the irregularity in the shape of the information recess has a tendency to exert more undesirable influences on the signal-to-noise ratio, as the size of the recess becomes similar. Such irregularity in the shape of the recess is in most cases ascribable to the fact that, upon melting and outward displacement of material of the recording medium as caused through irradiation of the focussed energy beam, a part of the molten material remains in the recess in a spherical form due to the surface tension and/or in a form of particle due to partial crystallization. In such case, the size of the spherical remainders and the crystallized particles will remain unchanged even if the size of the information recess is relatively decreased. Thus, the signal-to-noise ratio is subjected to more adverse influence, as the dimension of the information recess or hole is more reduced.

For the similar reason, it is practically impossible to attain a desirable signal-to-noise ratio in the case where the chalcogen glass or the crystalline chalcogen substance is used as the recording medium.

After many and various experiments, the inventors have discovered that a recording medium made of chalcogen glass and in particular amorphous chalcogen glass can exhibit a good recording performance or characteristic when chemical composition thereof is selected in an appropriate manner, as is disclosed in the specification of abandoned U.S. Patent Application Ser. No. 706,247, filed July 19, 1976, of the inventors of the present application as co-inventor with another. In this connection, it is however to be noted that the composition for the recording medium disclosed in the above U.S. patent application can exhibit desirable characteristics only when the recording of information is made immediately after the formation of the recording thin film and the reading-out of the information is carried out within a time span during which the recording medium is not yet subjected to variation in its characteristic. For example, when the recording medium as formed is exposed to air at a room temperature, the signal-to-noise ratio is significantly decreased with lapse of time. There, in practical applications, the decreasing of the signal-to-noise ratio involved significant problems on the reliability or accuracy of the information.

SUMMARY OF THE INVENTION

The main object of the present invention is to eliminate difficulties or disadvantage of the hitherto known information recording method using a laser.

In other words, the object of the invention is to provide an information recording method using a laser which can assure an improved signal-to-noise ratio and a high γ-characteristic for recorded information without being subjected to deterioration as a function of time.

To attain the above and other objects which will become apparent as the description proceeds, there is proposed according to the invention a method of recording information which comprises steps of forming on a predetermined substrate a thin film made substantially of an amorphous chalcogenide having a composition containing at least $As_x \cdot Te_y \cdot Se_z \cdot G_g$ wherein G represents at least one element selected from a group consisting of S, In, Tl, Sn, Pb and Ge, x is defined as $10$ at.% $\leq x \leq 25$ at.%, y is defined as $50$ at.% $\leq y \leq 88$ at.%, z is defined as $0$ at.% $\leq z \leq 40$ at.%, g is defined as $0$ at.% $\leq g \leq 10$ at.%, and further $x+y+z+g=100$ and $z+g \neq 0$, and projecting a laser beam onto the thus formed thin film to form recesses therein which represent information to be stored.

The thickness of the thin film should be in a range of 200 to 1000 Å and preferably in a range of 300 to 600 Å.

DETAILED DESCRIPTION OF THE PREFERRED EMBODIMENTS

Figure 1:
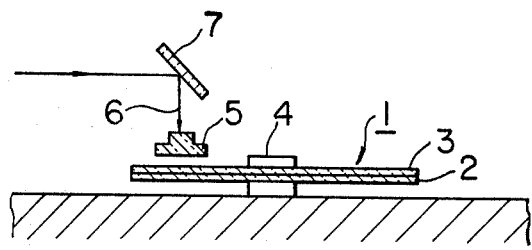
FIG. 1 illustrates schematically the principle of a method of recording information on a recording disk in a form of holes or recesses.

The information recording method using laser beam according to the invention is intended to eliminate the drawbacks of the hitherto known methods described hereinbefore.

With the invention, it is contemplated to provide an information recording method which allows the recorded information to be stored in the recording medium in a stable manner over a long period and at the same time to provide a thin film for the recording medium which allows extremely small recesses to be formed with a high accuracy upon writing-in of information even after a long time storage of the finished thin film without use.

In carrying-out the information recording method according to the invention, a substrate of glass may be employed with preference because such substrate is easy to obtain a desired flatness. Further, the substrate may be made of an organic polymer such as polymethyl methacrylate or of metal or of a composite structure of a metal and glass, oxide, sulfide or an organic polymer.

The substrate thus prepared is subsequently deposited with the recording thin film over a surface thereof through an evaporation process, for example. According to the teachings of the invention, the recording thin film is made of an amorphous chalcogenide having a composition of $As_x \cdot Te_y \cdot Se_z \cdot G_g$, wherein G represents at least one element selected from a group consisting of S, In, Tl, Sn, Pb and Ge, and x is in a range such that $10$ at.% $\leq x \leq 25$ at.%, y is in a range such that $50$ at.% $\leq y \leq 88$ at.%, z is in a range such that $0$ at.% $\leq z \leq 40$ at.% and g is in a range such that $0$ at.% $\leq g \leq 10$ at.% and that $x+g+z+y=100$ and $z+g \neq 0$.

It is believed that addition of As to chalcogen elements such as Te, Se is effective for forming cross-linkages among the chains of atom groups of Te or Se, thereby to increase viscosity in the molten or softened state. As a result, the composition is likely to become amorphous, which in turn is effective to make the film surface more flat. Upon recording, the tendency of element Te or the like to form spherical particles and disturb the shape of periphery of the information recess is positively suppressed. Thus, the signal-to-noise ratio (SN ratio) is prevented from being degraded. Further, it is also believed that addition of Se is also effective to make the composition more amorphous to promote the film surface to become more flat. Besides, addition of Se prevents Te from being oxidized. However, an excessive amount of Se as added will be disadvantageous in that the signal-to-noise ratio is likely to be degraded and an increased power is required for the recording.

Addition of elements such as S, In, Tl, Sn, Pb, and/or Ge involves the following advantage for the recording medium of amorphous chalcogen compounds. For example, element S serves to prevent the formation of raised peripheral edge of the recess and reduce the toxicity of the thin film. Elements such as In, Tl, Sn and Pb are effective for decreasing electric resistance and increasing the reflection coefficient. Element Ge serves to make the thin film more amorphous, increase the stability of the film and reduce the toxicity of the recording medium. It is however noted that excessive addition amounts of these elements will possibly cause disturbance in the shape of the information recesses, to lower the signal-to-noise ratio. The addition of these elements should not exceed 10% in number of atoms (10 at.%) and be greater than 2 at.%. Within this range, the advantageous properties due to addition of elements described above can be assured.

In addition to elements described above, the following elements may be added in a small amount. Namely, halogens, Si, P, Ag, Cu, Zn, Cd, Hg, Al, Ga, Sb, Bi, Mn, Fe, Co, Ni, Ce, V, Nb, Cr or the like. The addition of these elements should be lower than 10% in number of atoms (10 at.%) and preferably lower than 5 at.%.

Among others, it is particularly important that the content of As be restricted to an appropriate amount in order to attain one of the principal objects of the invention that the recording thin film be stored for a long period without being subjected to variations in properties.

In general, when a recording thin film containing As is used for recording information after having been left for a long time, it is impossible to have the written-in information having a good signal-to-noise ratio. Furthermore, even when information is recorded in the thin film immediately after the formation thereof, the signal-to-noise ratio of the information will be degraded upon reading-out thereof when a long time has elapsed from the information recording. Degree of the degradation in the signal-to-noise ratio will become more remarkably, as the As content of the recording medium is increased. Although the mechanism of such phenomenon can not be explained accurately, it is believed to be ascribable to that fact that As is likely to be oxidized to form a crystal of $As_2O_3$. On the other hand, when the contents of As are of an amount smaller than that a predetermined one, the thin film is difficult to become amorphous, as a result of which the signal-to-noise ratio of the written-in information will become lowered or degraded. The rate at which the signal-to-noise ratio is lowered is highest at the time immediately after the formation of the thin film and then progressively decreased finally to saturation after the elaspe of about six months.

Further, selection of thickness of the recording film is also of a great importance for obtaining an improved recording characteristic. For example, when practically useful video signals are to be reproduced, the thickness of the thin film should be selected from the range of 200 Å to 1000 Å, preferably be in the range of 300 Å to 600 Å and most preferably in the range of 350 Å to 480 Å. An excessive thickness of the film will involve a remarkably raised peripheral edge of the information recess as formed through irradiation of the laser beam. Consequently, when the writing-in of information is completed and the laser beam is removed, then material mass of the raised peripheral edge will flow down into the formed recess to disturb the shape thereof. Under such situation, the recording of the information can not be carried out with a high fidelity. Of course, the reflection coefficient will also be reduced to make the reading-out process impractical. On the other hand, an excessively thin film will involve such phenomenon that a portion of the film is separated from the remainder upon writing-in of information through the irradiation of the laser energy. Such separated and molten portion tends to form a spherical mass under the surface tension, bringing about random reflection of the reading-out light beam thereby to generate noise. The reflection coefficient of the film tends to be lowered.

Experiments have shown that, for the composition of the recording medium which assures the signal-to-noise ratio of 45 dB at the film thickness of 400 Å, the SN ratio is 43 dB at the film thickness of 350 Å, 40 dB at 300 Å, 35 dB at 200 Å, 43 dB at 480 Å, 40 dB at 600 Å, 38 dB at 800 Å and only 35 dB at the film thickness of 1000 Å.

Figure 2A:
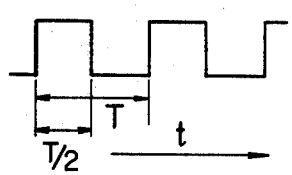
FIG. 2a is a waveform diagram showing a pattern of information to be recorded.
Figure 2B:
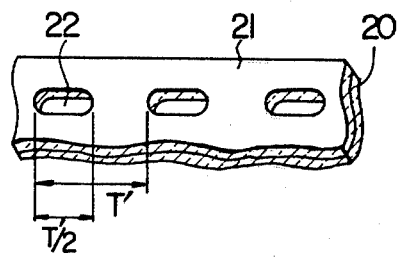
FIG. 2 illustrates simulatively how the recesses are formed in the recording thin film when the information pattern shown in FIG. 2a is written in with fidelity.
Figure 3A:
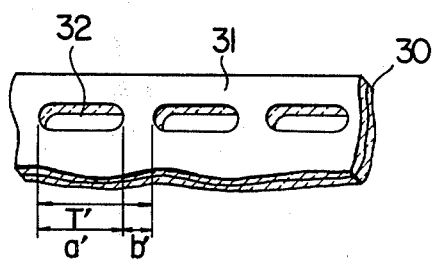
FIG. 3a illustrates simulatively the information recesses formed in a recording thin film when the information pattern shown in FIG. 2a is written in after a modification.
Figure 3B:
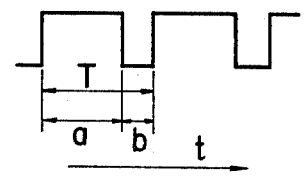
FIG. 3b is a waveform diagram showing a pulse pattern of the information represented by the recess array shown in FIG. 3a, FIG. 4 is a graph to illustrate dependence of an asymmetry factor on the thicknesses of the thin film constituting the recording medium.
Figure 4:
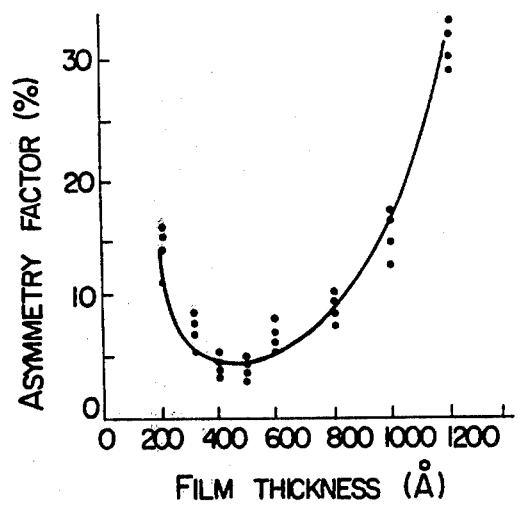

In connection with the write-in characteristic, it is necessary to consider not only the shape of the individual recesses but also the row or array of such recesses as formed by the laser beam correspondingly modulated in the intensity thereof. Now, description will be made on the relationship between the fidelity of the written-in signal and the thickness of the recording thin film. FIG. 2a illustrates graphically a waveform of a pulse-like signal of information to be written in. Time is taken along the abscissa and the symbol T represents a period of the information signal to be written in or recorded. In FIG. 2b, there is illustrated in what manner the recesses 22 are formed in the recording thin film 21, when the information signal shown in FIG. 2b is written in the thin film with a high fidelity. Reference numeral 20 denotes a disk-like substrate. In correspondence to the information signal shown in FIG. 2a, the recording thin film 21 has to be formed with the recesses of a longer diameter of T'/2 during a period T'. FIG. 3a illustrates schematically the pattern of recesses 32 which are formed in the recording thin film 31 when the information signal shown in FIG. 2a is written in after having undergone modification. The corresponding information pulse signal is shown in FIG. 3b in which the abscissa represents the time. The fidelity of the recesses formed in the thin film relative to the information signal is expressed by $$\frac{|b' - a'|}{T'} \times 100 \, (\%)$$

and herein referred to as "asymmetry factor". For the definition of the parameters a', b' and T' of the above expression, reference should be made to FIG. 3a. Relationship between the asymmetry factor and the thickness of the recording thin film is illustrated in FIG. 4 which is experimentally obtained under the conditions that the thin film is formed of $As_{22}Se_{18}Te_{60}$, the writing-in is carried out through an Ar laser (4579 Å) with the diameter of laser beam being 0.6 μm, and that the shorter diameter of the formed recess is 0.7 μm. As will be appreciated, the asymmetry factor becomes 0% when the information signal pattern is recorded with the highest fidelity. When the film thickness exceeds 1000 Å, the asymmetry factor will rapidly increase, as can be seen from FIG. 4. This means that such thickness is not suited for the practical recording film. On the other hand, in the range of the film thickness lower than 200 Å, the asymmetry factor will increase in a similar manner. Further, it becomes more difficult to form the thin film uniformly. The thickness in the above ranges is thus impractical. It will be understood that the range of the film thickness defined hereinbefore is preferable also from the standpoint of the fidelity with which the information recording is carried out. Further, FIG. 4 shows that the preferred range of the film thickness is between 300 Å and 600 Å.

The focussing of the laser beam may be effected in dependence upon shorter diameter of a recess. The optimum intensity of the laser beam should be varied slightly in dependence on the composition and thickness of the recording film. In the case where the film thickness is in the range of 350 Å to 480 Å, the laser intensity may be so selected that energy on the film surface is approximately from 6.0 mJ/cm² to 24.0 mJ/cm². The optimum laser energy will of course depend also on the film thickness. A practical criterion will be such that laser energy be increased 1.5 times for twice increase of the film thickness.

By way of an example, when the laser beam having a wavelength of about 4880 Å is used in combination with an optical system having an efficiency of 30%, it is possible to attain the intended objects of the invention with the laser output power of 20 mW to 80 mW. In most cases, irradiation duration of the laser beam is to be in the range of 10 ns to 500 ns. For the laser source, argon laser, helium-neon laser, YAG laser or many other lasers may be utilized.

It is possible without departing from the scope of the invention to provide a surface protection layer on the surface of the recording thin film and/or to provide an intermediate layer between the recording thin film and the substrate, thereby to improve the light absorption, bonding, and reflection coefficient of the thin film. However, when a decrease in the film thickness exceeding 100 Å or the formation of holes deeper than 100 Å occurs in the above layers due to the irradiation of the laser beam, then the disturbing action will be exerted to the shape of the recess and the surface flatness. For these reasons, practical compositions of these layers will be restricted to a certain range. The surface protection layer may be formed of amorphous materials of Sb-S-Ge series, Se-S-Ge series, Te-S-Ge series, Se-Ge series or S-Ge series each containing more than 65 at.% of S and more than 20 at.% of Ge or As-S series, As-S-Sb series and As-S-Se series. With these compositions, formation of recess having a depth of greater than 100 Å will scarcely exert adverse influence on the signal-to-noise ratio. In this connection, it is preferred that an intermediate layer having a continuously varied composition be formed in the interface region between the recording thin film and the protection layer through a simultaneous evaporation thereof.

EXAMPLE 1

35 at.% (percentage in terms of the number of atoms) of pulverized As and 65 at.% of pulverized Te were mixed together. 20 gr of thus obtained mixture was loaded into a quartz ample which was then evacuated to $5 \times 10^{-6}$ Torr and sealed off. The quartz ample was subsequently heated at 800° C. for more than three hours in an electrical furnace while vibrating the ample concurrently. Cooling of the ample was effected in ambient air at a room temperature. Thereafter, the quartz ample was broken to take out a compound of As and Te which were then crushed roughly.

Figure 5:
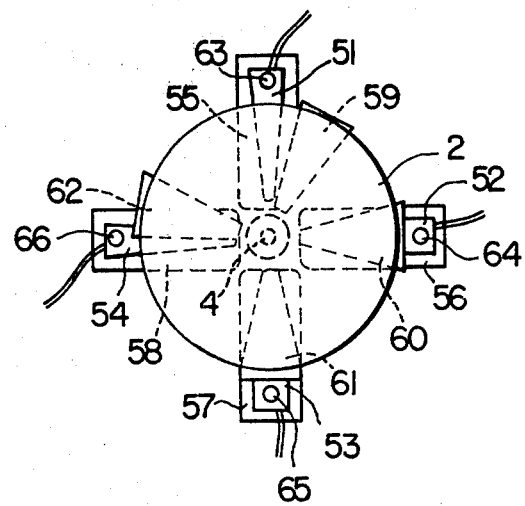
FIG. 5 is a plan view showing an apparatus for forming the recording thin film through evaporation.

FIG. 5 shows in a plan view an apparatus for forming the recording thin film through evaporation. A disk-like substrate formed of an optically polished and cleaned glass plate of 35.5 cm in diameter is disposed in the vacuum evaporation apparatus shown in FIG. 5, in which four evaporation boats are disposed. It should be noted that these boats are not shown but locations thereof are indicated by reference numerals 51, 52, 53 and 54. Each of the boats is disposed below the disk-like substrate 2 along a circumferential line of a circle which is coaxial with the center shaft 4 for rotating the disk. The distance between the disk-like substrate 2 and the individual boats was selected to be about 6 cm in this example. Each of these boats serves to protect the substrate from deposition of sputtered drops or particles of evaporated substances. To this end, the boat is of such structure that evaporation material can not be seen directly form the place where the thin film is formed through evaporation. Three of these boats were charged with $As_{35}Te_{65}$, Te and Se, respectively. Amount of $As_{35}Te_{65}$ charged in the associated boat is so selected that the film thickness will become about 800 Å when total amount of the evaporation material has been deposited on the substrate disk. There are disposed between the glass substrate disk and the individual boats sector-like slits 55, 56, 57 and 58 as well as associated shutter members 59, 60, 61 and 62 so that the sizes of apertures defined by the slits can be selectively controlled by the associated shutters in desired ratios. In this example, the aperture angle of the slits are selected at about 12°. After the apparatus has been evacuated to a vacuum level, the glass substrate disk 2 is rotated at 120 r.p.m. while current is conducted to the individual boats thereby to evaporate the materials contained in the boats. The evaporation amount from the boats were detected by film thickness monitors 63, 64, 65 and 66 of quartz oscillation type to control the currents fed to the boats so that the evaporation rate may be maintained at a constant value. The film thickness monitor of the quartz oscillation type is of such construction that deposition of evaporated material on a quartz oscillation element will cause the oscillation frequency thereof to be varied in dependence upon mass of the deposited material. From the variation in the oscillation frequency, it is possible to determine the status of evaporation.

By selectively controlling the aperture angles of the shutters provided for the individual boats at appropriate angles, thin films of various compositions were formed through evaporation.

When the evaporation amount from the boat containing $As_{35}Te_{65}$ reached a value which would be sufficient for forming a recording film having a thickness of about 150 Å when deposited on the substrate disk, the shutters were opened to form the evaporated film of about 400 Å in thickness. The duration during which the individual shutters were opened was about seven minutes. It has been found that the evaporated film surface becomes flatter, as the evaporation rate is selected higher. However, excessively high evaporation rate causes the particles of evaporated material to pass through the covers of the boats to reach the substrate disk, providing cause for generation of noise. Since the positive heating of the substrate disk was not effected, substantially no raise in temperature of the substrate was observed. The evaporated material from the boat was abundant in As during the initial phase of evaporation and the quantity of Te was progressively increased. Accordingly, content of As in the evaporated film as formed was more increased in the region nearer to the glass substrate. The composition of the deposited film on an average in the thickness direction was of $As_{20}Se_{15}Te_{65}$. When the shutters were opened at an earlier time, a thin film containing As in a quantity greater than the above value was formed. On the other hand, opening of the shutters at a later time resulted in the formation of the thin film containing Te in a greater quantity. Further, when the amount of $As_{35}Te_{65}$ charged in the boat was increased, a thin film of the composition of little variation in the direction of thickness could be obtained. It was also possible to form thin films of various compositions merely by varying time period during which the shutter associated with the single boat containing a material of As-Te-Se series or As-Te-Se-Ge series was opened. However, in the case of the evaporated films having substantially the same compositions on an average in the thickness direction, substantially same characteristics could be attained. All of the thin films formed through the evaporating processes described above were substantially amorphous. Determination of the amorphousness was made through transmitted electron diffraction, while the composition was determined through fluorescence X-ray analysis.

The recording of information on the recording disk having a glass substrate deposited with the recording film as described above is carried out in a manner shown in FIG. 1. In more particular, while the recording disk 1 of glass is being rotated at a high speed, e.g. at 1800 rpm, the recording heat 5 is moved toward the disk to a position spaced therefrom for a predetermined distance. The disk 1 was irradiated with a pulse-like laser beam of an argon ion laser having a wave length of 4579 Å and modulated in the pulse width and the pulse interval in accordance with video signals to be recorded after having been focussed through lens mounted in the recording head. For the recording film of composition of $As_{20}Se_{15}Te_{65}$, the output of the laser was set at about 28 mV. Under this condition, the power of laser beam reaching the evaporated recording film was about 9 mW. In other words, the efficiency of the optical system was about 30%. The materials of As-Te-Se series exhibited characteristically a large value of $\gamma$ which was an index used for indicating characteristics of various recording materials such as photographic films. Herein, the index $\gamma$ is defined as follows; namely, assuming that the absorbed energy is represented by E, while the mass of material removed from the location irradiated by the writing laser beam is represented by V, the index $\gamma$ is defined as maximum value of $dV/dE$. Accordingly, a large value of $\gamma$ means that a slight increase in the energy of the laser beam beyond a threshold value from a lower energy level will bring about a remarkable variation in the recording. In other words, a small variation in energy of the recording laser beam causes a condition in which the recording is utterly impossible to be changed to another condition in which the recording can be perfectly made. For the materials of As-Te-Se series, the value of $\gamma$ was on the order of $2 \times 10^{-3} \text{cm}^{-3}/\text{J}$. Such large value of $\gamma$ may be explained by the fact that, when a recess or hole is thermally formed in only a fragmental portion of an area irradiated by the recording energy beam, the softened or molten mass of the recording medium is urged to more radially outwardly under the action of the surface tension, whereby the initially formed recess is enlarged in area. Thus, the peripheral wall of the recess becomes steep to allow the information represented by the recess to be read out with a high accuracy. Further, due to such enlargement of the recess, a smooth peripheral edge can be obtained in the recess. It has been found that an elliptical recess having a shorter diameter of about 0.7 $\mu$m can be formed by using the laser beam described above. The recording head was so mounted that it can be radially displaced.

The recorded information was read out in the following manner. The disk was rotated at 1800 rpm and the reading head was moved toward the disk to a position spaced from the latter for a predetermined short distance. The disk was illuminated by a laser beam having a wave length of 6328 Å produced from a He-Ne laser of about 1 mW output power through a focussing lens system disposed in the reading head. Variation in the intensity of the reflected light beam was detected by a suitable detector.

In order to measure the signal-to-noise ratio, in place of video signals, a standard pulse signal of 6 MHz having a pulse width of about 65 ns was recorded in the disk utilizing an argon ion laser beam and thereafter the recorded signal was read out by using a laser beam produced by a He-Ne laser. The measured value was converted to one corresponding to the recording of color video signal.

As the result of the measurement of the signal-to-noise ratio conducted for the recording film having composition of $As_{20}Se_{15}Te_{65}$ prepared according to the present example, the signal-to-noise ratio of about 46 dB could be obtained when the signal was written in and read out immediately after the formation of the recording film. In the case where the recording was made on the thin film which had been left in a dustproof air chamber at a room temperature for six months and then the recorded information was read out, the signal-to-noise ratio as measured was about 45 dB. It will thus be appreciated that difference in the signal-to-noise ratio between the former and the latter cases is in the range of experimental error and thus negligible. In the following Table 1, there are summarized the averaged compositions in the thickness direction of the thin films prepared according to the present example and the corresponding signal-to-noise ratios (SN ratios).

TABLE 1

| Specimen No. | Composition | SN ratio (dB) | Specimen No. | Composition | SN ratio |
|---|---|---|---|---|---|
| 1 | $As_{20}Se_{15}Te_{65}$ | 45 | 16 | $As_2Se_{98}$ | 35 |
| 2 | $As_{12}Se_4Te_{84}$ | 40 | 17 | $As_{23}Se_{32}Te_{45}$ | 35 |
| 3 | $As_{11}Se_{19}Te_{70}$ | 40 | 18 | $As_{25}Se_{50}Te_{25}$ | 35 |
| 4 | $As_{11}Se_{29}Te_{60}$ | 40 | 19 | $As_{20}Se_{80}$ | 35 |
| 5 | $As_{10}Se_{40}Te_{50}$ | 40 | 20 | $As_{30}Te_{70}$ | 35 |
| 6 | $As_{21}Se_{29}Te_{50}$ | 40 | 21 | $As_{29}Se_{10}Te_{61}$ | 35 |
| 7 | $As_{22}Se_{18}Te_{60}$ | 40 | 22 | $As_{28}Se_{20}Te_{52}$ | 35 |
| 8 | $As_{25}Se_4Te_{71}$ | 40 | 23 | $As_5Te_{95}$ | 30 |
| 9 | $As_{10}Te_{90}$ | 35 | 24 | $Se_{30}Te_{70}$ | 30 |
| 10 | $As_8Se_{10}Te_{82}$ | 35 | 25 | $Se_{50}Te_{50}$ | 27 |
| 11 | $As_8Se_{22}Te_{70}$ | 35 | 26 | Se | 32 |
| 12 | $As_8Se_{33}Te_{59}$ | 35 | 27 | $As_{40}Te_{60}$ | 28 |
| 13 | $As_5Se_{55}Te_{40}$ | 35 | 28 | $As_{40}Se_{20}Te_{40}$ | 30 |
| 14 | $As_{15}Se_{40}Te_{45}$ | 35 | 29 | $As_{40}Se_{30}Te_{30}$ | 30 |
| 15 | $As_{15}Se_{60}Te_{25}$ | 35 | 30 | $As_{30}Se_{60}Te_{10}$ | 30 |

Note:
The specimens No. 9 to 30 are for the purpose of comparison.

Figure 6:
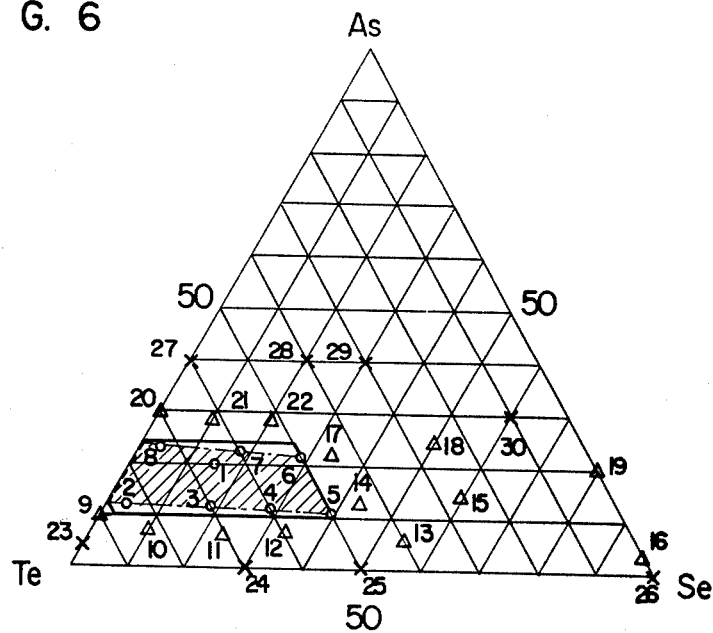
FIG. 6 is a composition diagram illustrating a composition range of an As-Se-Te material.

The range of compositions which can attain the aimed object of the invention is shown in FIG. 6 in which the compositions of specimens enumerated in the Table 1 are designated by the specimen numbers. The hatched area in FIG. 6 represents the range of composition in which the signal-to-noise ratio is stable independently from time elapse.

Figure 7:
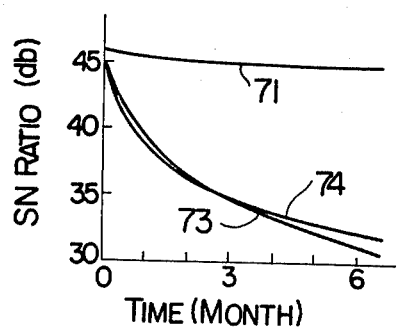
FIG. 7 illustrates graphically variation in the property of the As-Se-Te material as a function of time.

FIG. 7 graphically illustrates variations in characteristics of the signal-to-noise ratios as a function of elapsed time comparatively for typical compositions of the recording films. The signal-to-noise ratios were measured by recording a signal in the recording films immediately after the formation thereof and reproducing the signal at various time moments. In FIG. 7, a curve 71 is for the composition of $As_{20}Se_{15}Te_{65}$, a curve 73 is for the composition of $As_{35}Te_{65}$, and a curve 74 is for the composition of $As_{40}Se_{30}Te_{30}$. It will be appreciated from comparison of these curves that the material of the compositions in the range defined in accordance with the teachings of the invention exhibits excellent stability.

EXAMPLE 2

In a similar manner as is in the case of the preceding Example 1, materials having compositions of $As_{35}Te_{65}$ and $Ge_{15}Te_{85}$, respectively, were synthesized in quartz amples. The composition $Ge_{15}Te_{85}$ was heated at 1000° C. in the electric furnace.

As is in the case of the Example 1, a glass disk of 35.5 cm in diameter having a polished mirror surface is disposed in a vacuum evaporation apparatus so that the disk can be rotated about the center axis thereof. The vacuum evaporation apparatus as used is of the same construction as the one employed in the Example 1. Three of evaporating boats were used and charged with $As_{35}Te_{65}$, $Ge_{15}Te_{85}$ and Te. The compositions in the three boats were simultaneously vaporized and a thin film having the averaged composition of $As_{20}Ge_5Te_{75}$ was formed by correspondingly adjusting the aperture angles of the shutters for the boats. The film thickness was selected at about 400 Å. The rotation number of the substrate disk was 120 rpm. The substrate was not heated.

The recording and reproducing of information in and from the recording film were performed in the similar manner as is in the case of the Example 1.

In the present example, the signal-to-noise ratio was 43 dB when the recording and reproduction were made immediately after the preparation of the recording film. In the measurement conducted after elapse of six months, the signal-to-noise ratio of 42 dB was obtained. There is substantially no difference between these signal-to-noise ratios, which difference may be neglected as experimental error. Element Ge is effective for preventing oxidization of As.

In addition to the above mentioned compositions, measurements were conducted for various recording films having different compositions after six months have elapsed since the formation of the films. Results are summarized in the Table 2.

TABLE 2

| Specimen No. | Composition | SN ratio (dB) | Specimen No. | Composition | SN ratio (dB) |
|---|---|---|---|---|---|
| 1 | $As_{10}Ge_5Te_{85}$ | 40 | 10 | $As_8Ge_{15}Te_{77}$ | 35 |
| 2 | $As_{10}Ge_{10}Te_{80}$ | 40 | 11 | $As_{15}Ge_{20}Te_{65}$ | 35 |
| 3 | $As_{20}Ge_{10}Te_{70}$ | 40 | 12 | $As_{30}Ge_5Te_{65}$ | 35 |
| 4 | $As_{25}Ge_5Te_{70}$ | 40 | 13 | $As_7Ge_5Te_{88}$ | 35 |
| 5 | $As_{20}Ge_2Te_{78}$ | 43 | 14 | $As_{30}Ge_{20}Te_{50}$ | 30 |
| 6 | $As_{15}Ge_2Te_{83}$ | 43 | 15 | $As_5Ge_{40}Te_{55}$ | 28 |
| 7 | $As_{12}Ge_1Te_{87}$ | 40 | | | |
| 8 | $As_{19}Ge_1Te_{80}$ | 40 | | | |
| 9 | $As_{25}Ge_1Te_{74}$ | 40 | | | |

Note:
Specimens Nos. 10 to 15 are for comparison.

Figure 8:
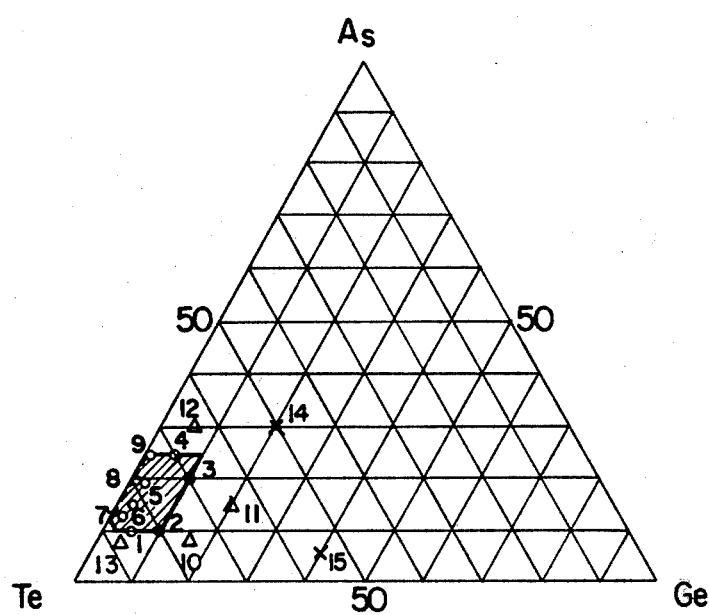
FIG. 8 is a composition diagram showing the composition range of the As-Te-Ge material.

FIG. 8 illustrates the range of compositions which can attain the aimed objects of the invention. In this figure, the compositions are denoted by the associated specimen numbers in the Table 2. The hatched area represents the composition range in which the signal-to-noise ratio is stable against variations as time elapses.

Recording can be effected in a similar manner in films of compositions containing S, In, Tl, Sn or Pb. Typical examples of such compositions are listed up in Table 3 together with the respective signal-to-noise ratios.

TABLE 3

| Specimen No. | Composition | SN ratio (dB) |
|---|---|---|
| 1 | $As_{15}Te_{75}Ge_7Pb_3$ | 40 |
| 2 | $As_{15}Te_{77}S_8$ | 40 |
| 3 | $As_{15}Te_{80}Sn_5$ | 40 |
| 4 | $As_{20}Te_{78}Tl_2$ | 39 |
| 5 | $As_{15}Te_{75}Ge_6S_4$ | 40 |
| 6 | $As_{18}Te_{64}Se_{15}Ge_3$ | 40 |
| 7 | $As_{15}Te_{69}Se_8In_8$ | 40 |
| 8 | $As_{15}Te_{75}Ge_8Tl_2$ | 40 |

TABLE 3-continued

| Specimen No. | Composition | SN ratio (dB) |
|---|---|---|
| 9 | $As_{15}Te_{75}Ge_8Sn_2$ | 40 |

What is claimed is:

1. A method of recording information in at least one thin film formed on a predetermined substrate by irradiating said at least one thin film with a laser ray beam in accordance with said information to form in said at least one thin film holes or recesses, said irradiating being sufficient to heat said at least one thin film to be softened and displaced or evaporated, said holes or recesses representing said information, wherein said at least one thin film is made of a substantially amorphous chalcogenide having a composition of $As_x \cdot Te_y \cdot Se_z \cdot G_g$, where G represents at least one element selected from a group consisting of S, In, Tl, Sn, Pb and Ge, and where 10 at $\% \leq x \leq 25$ at %, 50 at $\% \leq y \leq 88$ at %, 0 at $\% \leq z \leq 40$ at % and 0 at $\% \leq g \leq 10$ at %, and that $x+y+z+g=100$ and $z+g \neq 0$.

2. An information recording method according to claim 1, wherein thickness of said at least one thin film is in a range of 200 Å to 1000 Å.

3. An information recording method according to claim 1, wherein thickness of said at least one thin film is in a range of 300 Å to 600 Å.

4. An information recording method according to claim 1, wherein thickness of said at least one thin film is in a range of 350 Å to 480 Å and wherein said laser beam is so projected onto said at least one thin film that energy level on the surface of said at least one thin film is in a range of 6.0 mJ/cm² to 24.0 mJ/cm².

5. An information recording method according to claim 4, wherein an argon laser is used as a source of said laser beam.

6. An information recording method according to claim 1, wherein said substrate is formed of glass.

7. An information recording method according to claim 1, wherein said at least one thin film is made of a substantially amorphous chalcogenide having a composition of $As_x \cdot Te_y \cdot Se_z \cdot G_g$, where G represents at least one element selected from a group consisting of S, In, Tl, Sn, Pb and Ge, and where 10 at $\% \leq x \leq 25$ at %, 50 at $\% \leq y \leq 88$ at %, 0 at $\% \leq z \leq 40$ at % and 2 at $\% \leq g \leq 10$ at % and that $x+y+z+g=100$.

8. An information recording method according to claim 7, wherein thickness of said at least one thin film is in a range of 200 Å to 1000 Å.

9. An information recording method according to claim 7, wherein thickness of said at least one thin film is in a range of 300 Å to 600 Å.

10. An information recording method according to claim 9, wherein thickness of said at least one thin film is in a range of 350 Å to 480 Å and wherein said laser beam is so projected onto said at least one thin film that energy level on the surface of said at least one thin film is in a range of 6.0 mJ/cm² to 24.0 mJ/cm².

11. An information recording method according to claim 1, wherein said at least one thin film is made of a substantially amorphous chalcogenide having a composition of $As_x \cdot Te_y \cdot Se_z$, where 10 at.$\% \leq x \leq 25$ at.%, 50 at.$\% \leq y \leq 88$ at.% and 0 at.$\% < z \leq 40$ at.%, and $x+y+z=100$.

12. An information recording method according to claim 11, wherein thickness of said at least one thin film is in a range of 200 Å to 1000 Å.

13. An information recording method according to claim 11, wherein thickness of said at least one thin film is in a range of 300 Å to 600 Å.

14. An information recording method according to claim 11, wherein thickness of said at least one thin film is in a range of 350 Å to 480 Å and wherein said laser beam is so projected onto said at least one thin film that energy level on the surface of said at least one thin film is in a range of 6.0 mJ/cm$^2$ to 24.0 mJ/cm$^2$.

15. An information recording method according to claim 1, wherein said at least one thin film is made of a substantially amorphous chalcogenide having a composition of $As_x \cdot Te_y \cdot Se_z \cdot Ge_g$, where 10 at.% $\leq x \leq$ 25 at.%, 50 at.% $\leq y \leq$ 88 at.%, 0 at.% $\leq z \leq$ 40 at.% and 0 at.% $\leq g \leq$ 10 at.%, and that $x+y+z+g=100$ and $z+g \neq 0$.

16. An information recording method according to claim 15, wherein thickness of said at least one thin film is in a range of 200 Å to 1000 Å.

17. An information recording method according to claim 15, wherein thickness of said at least one thin film is in a range of 300 Å to 600 Å.

18. An information recording method according to claim 15, wherein thickness of said at least one thin film is in a range of 350 Å to 480 Å, and wherein said laser beam is so projected onto said at least one thin film that energy level on the surface of said at least one film is in a range of 6.0 mJ/cm$^2$ to 24.0 mJ/cm$^2$.

19. An information recording method according to claim 1, wherein said at least one thin film is made of a substantially amorphous chalcogenide having a composition of $As_x \cdot Te_y \cdot Ge_g$, where 10 at.% $\leq x \leq$ 25 at.% $\leq y \leq$ 88 at.% and 0 at.% $< g \leq$ 10 at.% and that $x+y+g=100$.

20. An information recording method according to claim 19, wherein thickness of said at least one thin film is in a range of 200 Å to 1000 Å.

21. An information recording method according to claim 19, wherein thickness of said at least one thin film is in a range of 300 Å to 600 Å.

22. An information recording method according to claim 19, wherein thickness of said at least one thin film is in a range of 350 Å to 480 Å and wherein said laser beam is so projected onto said at least one thin film that energy level on the surface of said at least one thin film is in a range of 6.0 mJ/cm$^2$ to 24.0 mJ/cm$^2$.

23. An information recording method according to claim 1, wherein said at least one thin film is made of a substantially amorphous chalcogenide having a composition of $As_x \cdot Te_y \cdot Ge_g$, where 10 at.% $\leq x \leq$ 25 at.%, 50 at.% $\leq y \leq$ 88 at.% and 2 at.% $\leq g \leq$ 10 at.% and that $x+y+g=100$.

24. An information recording method according to claim 23, wherein thickness of said at least one thin film is in a range of 200 Å to 1000 Å.

25. An information recording method according to claim 23, wherein thickness of said at least one thin film is in a range of 300 Å to 600 Å.

26. An information recording method according to claim 23, wherein thickness of said at least one thin film is in a range of 350 Å to 480 Å and wherein said laser beam is so projected into said at least one thin film that energy level on the surface of said at least one thin film is in a range of 6.0 mJ/cm$^2$ to 24.0 mJ/cm$^2$.

27. An information recording method according to claim 1, wherein an intermediate layer is positioned between said at least one thin film and said substrate.

28. An information recording method according to claim 1, wherein a surface protection layer is positioned on the surface of said at least one thin film.

29. An information recording method according to claim 28, wherein said surface protection layer is selected from the group of materials consisting of amorphous materials of Sb-S-Ge series, Se-S-Ge series, Te-S-Ge series, Se-Ge series or S-Ge series, containing more than 65 at.% of S and more than 20 at.% of Ge or As-S series, As-S-Sb series and As-S-Se series.

30. A method of recording information in at least one thin film on a predetermined substrate by irradiating said at least one thin film with a laser ray beam in accordance with said information to form in said at least one thin film holes or recesses, said irradiating being sufficient to heat said at least one thin film to be softened and displaced or evaporated, said holes or recesses representing said information, wherein said at least one thin film is made of a substantially amorphous chalcogenide having a composition of $As_x \cdot Te_y \cdot Se_z \cdot G_g \cdot D_d$, where G represents at least one element selected from the group consisting of S, In, Tl, Sn, Pb and Ge, and D is selected from the group consisting of halogens, Si, P, Ag, Cu, Zn, Cd, Hg, Al, Ga, Sb, Bi, Mn, Fe, Co, Ni, Ce, V, Nb and Cr, and where 10 at.% $\leq x \leq$ 25 at.%, 50 at.% $\leq y \leq$ 88 at.%, 0 at.% $\leq z \leq$ 40 at.%, 0 at.% $\leq g \leq$ 10 at.%, 0 at.% $< d \leq$ 10 at.%, $x+y+z+g+d=100$ and $z+g \neq 0$.

31. An information recording method according to claim 30, wherein thickness of said at least one thin film is in a range of 200 Å to 1000 Å.

32. An information recording method according to claim 31, wherein 0 at.% $< d \leq$ 5 at%.

33. An information recording method according to claim 30, wherein 0 at.% $< d \leq$ 5 at.%.

34. An information recording method according to claim 1, wherein said irradiating acts to form directly in said at least one thin film holes or recesses.

35. An information recording method according to claim 30, wherein said irradiating acts to form directly in said at least one thin film holes or recesses.

* * * * *